United States Patent
Su et al.

(10) Patent No.: US 9,473,130 B2
(45) Date of Patent: Oct. 18, 2016

(54) SAWTOOTH OSCILLATOR AND APPARATUSES

(71) Applicant: NXP B.V., Eindhoven (NL)

(72) Inventors: Chiahung Su, Tempe, AZ (US); Madan Mohan Reddy Vemula, Tempe, AZ (US)

(73) Assignee: NXP B.V., Eindhoven (NL)

(*) Notice: Subject to any disclaimer, the term of this patent is extended or adjusted under 35 U.S.C. 154(b) by 287 days.

(21) Appl. No.: 14/048,689

(22) Filed: Oct. 8, 2013

(65) Prior Publication Data

US 2015/0097516 A1    Apr. 9, 2015

(51) Int. Cl.
| | |
|---|---|
| H03K 5/22 | (2006.01) |
| H03K 4/08 | (2006.01) |
| H03K 4/94 | (2006.01) |
| H02J 7/00 | (2006.01) |
| G06F 1/02 | (2006.01) |

(52) U.S. Cl.
CPC ............ *H03K 5/22* (2013.01); *H03K 4/08* (2013.01); *H03K 4/94* (2013.01); *G06F 1/02* (2013.01); *H02J 7/0052* (2013.01)

(58) Field of Classification Search
CPC ......... H02J 7/0052; H03K 4/08; H03K 4/94; H03K 5/22; G06F 1/02
See application file for complete search history.

(56) References Cited

U.S. PATENT DOCUMENTS

| | | | | |
|---|---|---|---|---|
| 3,881,495 A | * | 5/1975 | Pannozzo | A61N 1/0456 607/55 |
| 4,608,499 A | * | 8/1986 | Rathmann | H02M 1/4208 307/66 |
| 5,486,741 A | * | 1/1996 | George | H04N 3/26 315/382 |
| 5,793,628 A | * | 8/1998 | Koch | H02M 3/1584 363/152 |
| 6,841,985 B1 | * | 1/2005 | Fetzer | G01R 25/005 324/76.52 |
| 2004/0218405 A1 | * | 11/2004 | Yamada | H02M 3/335 363/18 |
| 2006/0261885 A1 | * | 11/2006 | Poulsen | H03F 1/32 330/10 |
| 2011/0148481 A1 | * | 6/2011 | Chung | H03K 4/501 327/137 |
| 2012/0194278 A1 | | 8/2012 | Bugbee et al. | |
| 2014/0028236 A1 | * | 1/2014 | Suzuki | H02P 23/00 318/503 |

* cited by examiner

*Primary Examiner* — Thomas Lee
*Assistant Examiner* — Chad Erdman

(57) ABSTRACT

Various aspects of the disclosure are directed to methods and apparatuses involving providing a clock signal. As consistent with one or more embodiments herein, a sawtooth waveform signal is generated in a manner that facilitates low power operation. In some implementations, the sawtooth waveform signal is generated using an oscillator that operates without necessarily employing R-C circuits and/or without rail-to-rail voltage supply, such as via a nonlinear oscillator. The sawtooth waveform signal is used to generate a trapezoidal waveform signal, and a clock signal is generated using the trapeziodal waveform signal.

18 Claims, 6 Drawing Sheets

SAWTOOTH OSCILLATOR AND APPARATUSES

Aspects of various embodiments are directed to oscillators and various apparatuses employing such oscillators.

Oscillators are used in a multitude of applications, with many different types of devices. For instance, many integrated circuit devices require stable oscillators to provide the reference clocks used in the system. In one such example involving connection detection circuitry for portable devices, a short sampling timing window can be utilized to detect a connection event for accessory devices. The period of the sampling window can be controlled using an on-chip oscillator to generate a reference clock signal as an input to a digital counter. Such connection detection circuitry is often always active regardless of battery life or the existence of a battery charging event.

Ring or relaxation oscillator architectures can be employed to generate a reference clock signal. Ring oscillators (e.g., with an odd number of NOT gates whose output oscillates between two voltage levels) often require full charge and discharge of parasitic capacitance from CMOS transistors used therein, such that the ring oscillator needs to charge and discharge rail-to-rail. However, this can lead into higher oscillation frequency (e.g., a few Mhz) and higher current consumption (e.g., a few ten microamperes). Further, relaxation oscillators may require implementation of a bulky resistor and capacitor (R-C circuits) for achieving low-power consumption, which can lead to high area overhead (e.g., on a silicon chip). In addition, the current consumption of a relaxation oscillator is proportional to increasing supply voltage, which can be undesirable for low-power designs.

These and other matters have presented challenges to timing-based applications, such as those involving the generation of a clock signal, for a variety of applications.

Various example embodiments are directed to oscillator circuits and their implementation, and to addressing challenges including those discussed above.

According to an example embodiment, a sawtooth waveform signal is generated using a nonlinear oscillator, and a trapezoidal waveform signal is generated using the sawtooth waveform signal. A clock signal is generated based upon the sawtooth waveform signal and the trapezoidal signal. In a more particular implementation, the sawtooth waveform signal is generated using a reference current source that is controlled based upon temperature, and counters temperature-related fluctuations in the output of the sawtooth waveform signal and/or the clock signal. These and other approaches as follow may, for example, be used to address challenges as stated above, and may relate by way of example to circuits employing rail-to-rail clock generation, or R-C type circuits.

According to another example embodiment, an apparatus includes a first circuit having a nonlinear oscillator, and which generates a sawtooth waveform output. A second circuit is coupled to receive the sawtooth waveform output and generates a trapezoidal waveform output using the sawtooth waveform output. A comparator circuit generates a clock signal based upon the sawtooth waveform output and the trapezoidal waveform output. In a more particular implementation, the first circuit includes and/or operates using a reference current source that is controlled based upon temperature.

Another example embodiment is directed to an apparatus having a communication port that couples to an external communication circuit and communicates both data and power therewith. A charging circuit charges a battery that powers the apparatus, using power received from the external communication circuit via the communication port. A current reference circuit generates a reference current, and a sawtooth waveform generator circuit is coupled to the current reference circuit and generates a sawtooth waveform output based on the reference current. A trapezoidal waveform shaper circuit is coupled to receive the sawtooth waveform output and provides a trapezoidal waveform output using the sawtooth waveform output. A comparator circuit receives the trapezoidal waveform output and generates a clock signal based upon the trapezoidal waveform output, and a counter circuit generates a sampling window output having a time period that is based upon the clock signal. A connection detection circuit monitors the communication port during the time period of the sampling window, based on the sampling window output, and couples the power from the communication port to the charging circuit in response to sensing power provided to the communication port by the external communication circuit.

The above discussion/summary is not intended to describe each embodiment or every implementation of the present disclosure. The Figures and detailed description that follow also exemplify various embodiments.

Various example embodiments may be more completely understood in consideration of the following detailed description in connection with the accompanying drawings, in which.

Figure 1:
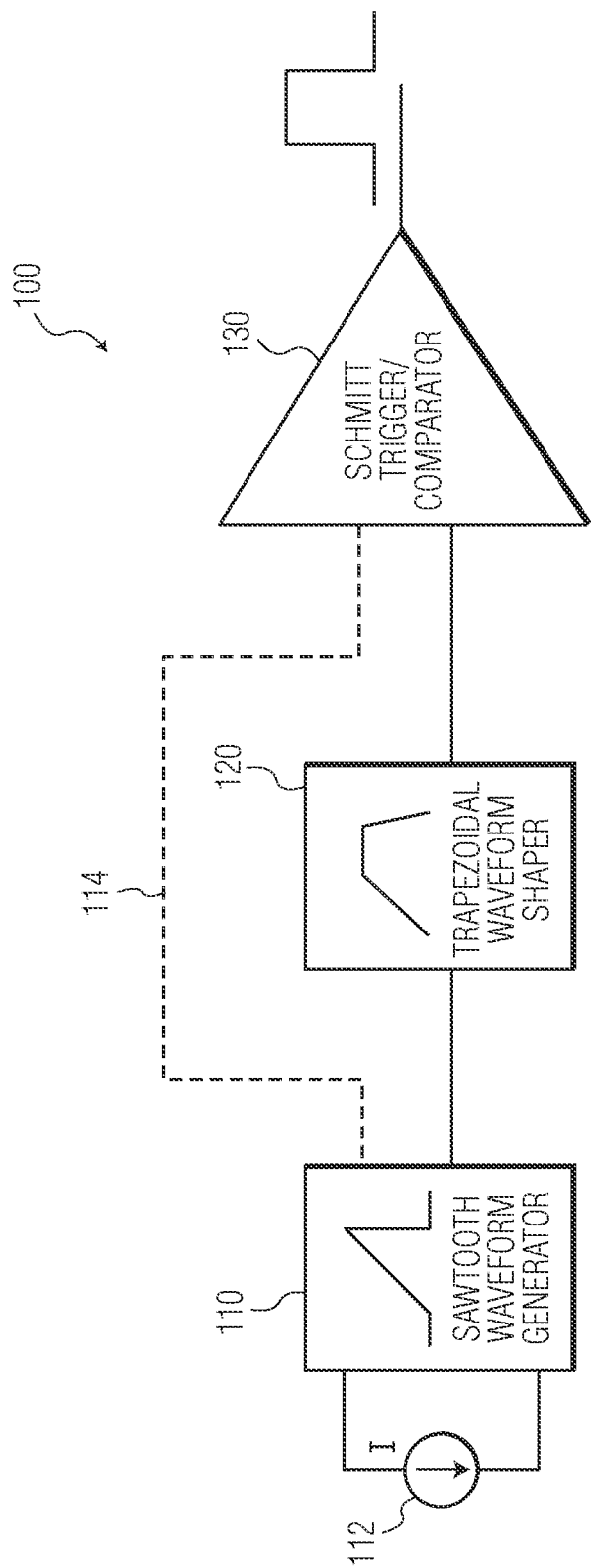
FIG. 1 shows an oscillator apparatus, in accordance with an example embodiment of the present invention.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving oscillators. While not necessarily so limited, various aspects may be appreciated through a discussion of examples using this context.

Various example embodiments are directed to an oscillator-type circuit having a sawtooth waveform generator and trapezoidal waveform generator in series. A comparator is coupled to an output of the trapezoidal waveform generator and uses the output to provide an oscillator/clock signal. In some implementations, the sawtooth waveform generator is a three-stage active-load inverter cascaded as a ring oscillator, operated using a current reference circuit that generates biasing current for active loads.

The oscillator-type circuit may be implemented with a variety of types of devices. In some implementations, the oscillator-type circuit is implemented with connection detection circuits that operate using an output of the comparator as a basis upon which to monitor a connection port for the presence of a circuit connected thereto. Such an implementation may, for example, involve monitoring for the connection of a circuit that provides power, such as for a multi-use port that communicates both power and data (or, e.g., in some instances communicates data without power).

These and other embodiments may be employed to mitigate issues, such as those discussed above, as may relate to using rail-to-rail output voltage and/or bulky R-C circuits in connection with connection detection circuitry, or other types of circuitry. Further, the circuit structure may be implemented in a relatively low/reduced area of a device, facilitating compact implementation.

A variety of approaches to generating a clock signal as described above and otherwise may be implemented in accordance with other embodiments discussed herein, such as in connection with the approach shown above in connection with the Figures. In one such embodiment, a sawtooth waveform signal is generated using a nonlinear oscillator, and a trapezoidal waveform signal is generated using the sawtooth waveform signal. A clock signal is generated based upon the sawtooth waveform signal and the trapezoidal signal.

In a more particular implementation, a time period of a sampling window is controlled based upon the clock signal, and power provided to a communication port via an external communication circuit is sensed during the time period of the sampling window. In this context, sensing the presence of power may include sensing power (or lack thereof) as provided via a power/data connector that is connected to a power source, and can be used to charge a battery that operates the circuitry that generates the clock signal. In response to sensing the power, power from the communication port is coupled to a charging circuit, and a battery is charged using power provided via the communication port and the charging circuit.

The clock signal can be generated using a variety of approaches. In some embodiments, the clock signal is generated based upon both the trapezoidal waveform output and the sawtooth waveform output, using a comparator having first and second inputs respectively coupled to receive the trapezoidal and sawtooth waveform outputs. In another embodiment, the clock signal is generated using the trapezoidal waveform output and a voltage connection (e.g., using a Schmitt trigger).

A variety of oscillator circuits can be used to suit particular applications. Such oscillators may, for example, employ an oscillator that generates a non-sinusoidal output, and having an energy-storing component and a nonlinear switching circuit that periodically charges and discharges the energy-storing component. For example, a relaxation oscillator, multivibrator oscillator, delay line oscillator, rotary travelling wave oscillator or a ring oscillator can be used for different implementations. In certain embodiments, the sawtooth waveform output is generated using a ring oscillator and a biasing current, in which the ring oscillator is susceptible to temperature-based fluctuations that alter the generated oscillator signal under a fixed biasing current. These temperature-based fluctuations are mitigated by controlling a level of the biasing current provided to the ring oscillator. In other embodiments a ring oscillator having a three-stage active-load inverter is employed, in which the inverters are connected in series and a feedback circuit connects an output of the last stage in the series to a first stage in the series.

Various apparatuses, circuits and systems may be employed to effect clock generation in accordance with embodiments herein. According to another example embodiment, an apparatus includes first and second waveform circuits, and a comparator that generates a clock signal based on outputs of the waveform circuits. The first circuit has a nonlinear oscillator and generates a sawtooth waveform output, and the second circuit generates a trapezoidal waveform output using the sawtooth waveform output. The comparator circuit generates the clock signal based upon the sawtooth and trapezoidal waveform outputs (e.g., by using the trapezoidal waveform and/or using both waveforms). As discussed above, various types of nonlinear oscillators may be used with the first circuit. In some implementations, the nonlinear oscillator is a ring oscillator having a three-stage active-load inverter including three inverters connected in series, and a feedback circuit that connects an output of a last stage in the series to a first stage in the series.

In some embodiments, the first circuit includes and/or operates using a reference/biasing current source that is controlled based upon temperature. In one such embodiment, the nonlinear oscillator generates the sawtooth waveform output using the biasing current and is susceptible to temperature-based fluctuations that alter the generated oscillator signal under a fixed biasing current. The current source is a complementary to absolute temperature (CTAT) current reference circuit that controls operation of the nonlinear oscillator by generating the biasing current at different levels in response to the temperature-based fluctuations. In another such embodiment, the nonlinear oscillator is a ring oscillator having a three-stage active-load inverter, in which each stage is coupled to receive and use the biasing current for active loads in each stage of the inverter. In yet another such embodiment, the current reference circuit generates the reference current at a first level, and in response to a change in temperature, controls current consumption of the first and second circuits by generating the reference current at a second level that is different than the first level.

A variety of comparator circuits can be used to suit particular applications. In some embodiments, the comparator circuit has a first input coupled to receive the trapezoidal waveform output, and a second input coupled to receive the sawtooth waveform output. The comparator generates the clock signal based upon both the trapezoidal waveform output and the sawtooth waveform output respectively presented at the first and second inputs. In another embodiment, the comparator is a Schmitt trigger. In still another embodiment, the comparator generates the clock signal as a square wave having a duty cycle of about 50%.

In a more particular embodiment, the clock signal is used with a connection detection circuit, a communication port and a charging circuit that charges a battery using power provided via the communication port. The communication port couples to external communication circuits and to communicate data and power with the external communication circuits. The connection detection circuit is coupled to an output of the comparator circuit and has a digital counter that controls a time period of a sampling window based upon the clock signal, senses the presence of power provided to the communication port via an external communication circuit during the time period of the sampling window, and couples sensed power from the communication port to the charging circuit.

Turning now to the Figures, FIG. 1 shows an oscillator apparatus 100, in accordance with another example embodiment of the present invention. The apparatus 100 includes a sawtooth waveform generator 110, a trapezoid wave shaper 120 and a comparator 130. The sawtooth waveform generator 110 generates a sawtooth waveform output using a reference current provided by a current source 112. The trapezoid wave shaper 120 is connected to receive and use the sawtooth waveform output to generate a trapezoid waveform output. The comparator 130 uses the sawtooth waveform output to generate a clock signal, such as a square-wave clock signal as shown by way of example.

Different types of comparators can be used to suit particular applications. In some implementations, comparator 130 is a Schmitt trigger, in which a reference is used with the trapezoidal waveform output to generate the clock signal. In other implementations, the comparator 130 is coupled to receive the sawtooth waveform output via link 114, and generates the clock signal by comparing the values of the trapezoidal waveform output and the sawtooth waveform output.

In some embodiments, the sawtooth waveform generator 110 includes an oscillator that operates in a manner that facilitates power reduction relative, for example, to oscillators employing rail-to-rail output voltage and/or R-C circuits. In some implementations, the sawtooth waveform generator 110 is a cascaded three-stage active-load inverter. A current reference circuit that generates biasing current for active loads can be used to operate the inverter, and may be implemented to compensate for temperature and/or processing fluctuations.

Figure 2:
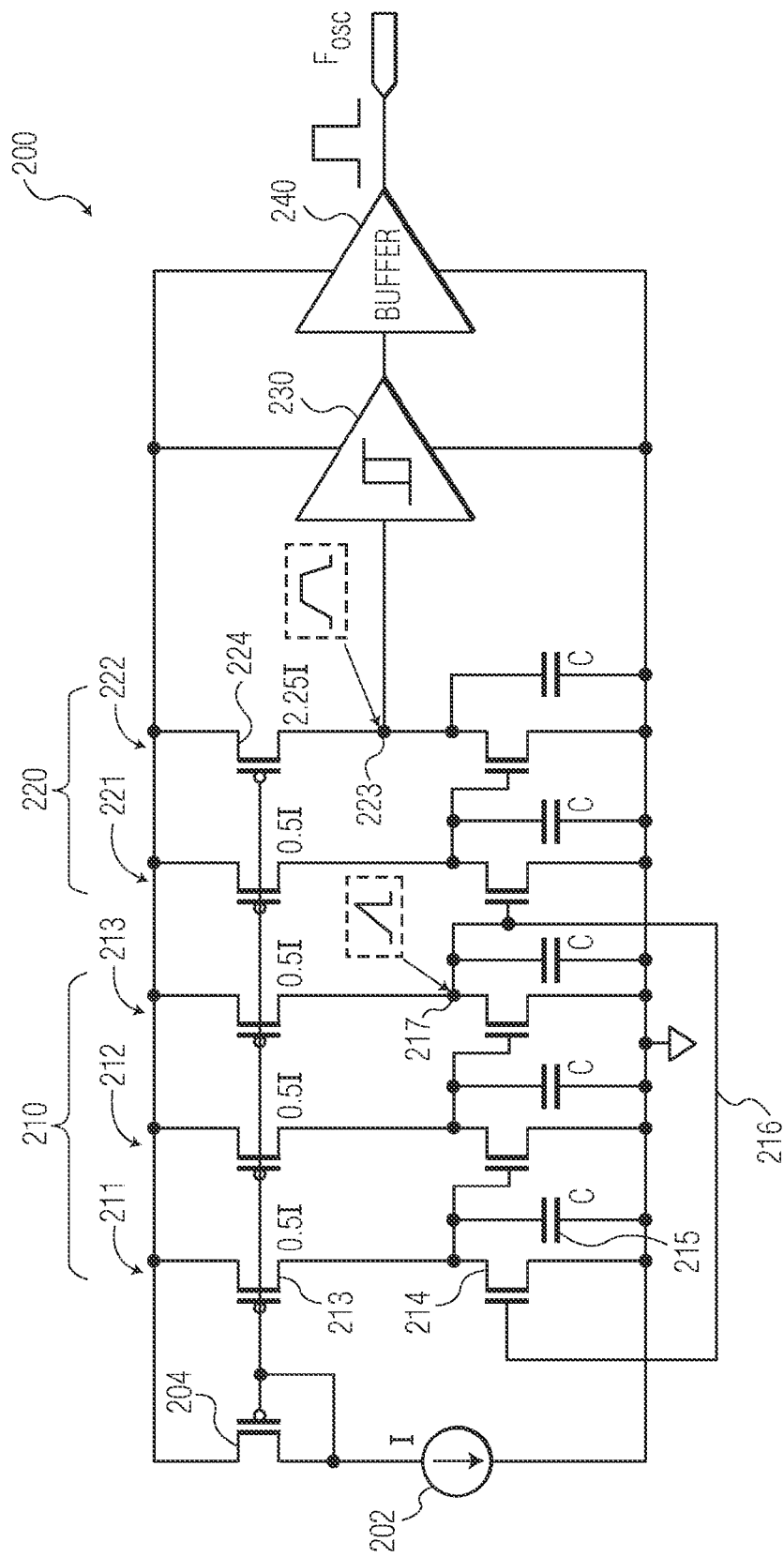
FIG. 2 shows another oscillator apparatus employing a Schmitt trigger, in accordance with an example embodiment of the present invention.

FIG. 2 shows another oscillator apparatus 200 employing a Schmitt trigger, in accordance with another example embodiment of the present invention. The apparatus 200 includes sawtooth waveform generator circuitry 210, trapezoidal wave shaper circuitry 220, a Schmitt trigger 230 and a buffer 240. The sawtooth waveform generator circuitry 210 is coupled to receive a reference current from a current source 202 and transistor 204, and includes three stages 211, 212 and 213. By way of example, components of stage 211 are labeled and include transistor 218, transistor 214 and capacitor 215. A feedback loop 216 couples a sawtooth output of the third stage 213 at node 217 to the input of the first stage 211 at the gate of transistor 214.

The trapezoidal wave shaper circuitry 220 includes stages 221 and 222, each having transistors and a capacitor, similar to that labeled in stage 211 and described above. Each of the transistors in stages 211, 212, 213 and 221 are shown by way of example as passing a current of a value of 0.5I for a 50% duty cycle, with I being the reference current generated via current source 202. The duty cycle is programmable by changing capacitance and charging current. The output of the trapezoidal wave shaper circuitry 220 at node 223 is a trapezoidal waveform, with the current at transistor 224 being 2.25I.

The Schmitt trigger 230 is coupled to node 223 to receive the trapezoidal waveform, and generates a square wave clock signal from the trapezoidal waveform. This clock signal is passed as an output oscillation signal, via buffer 240.

Figure 3:
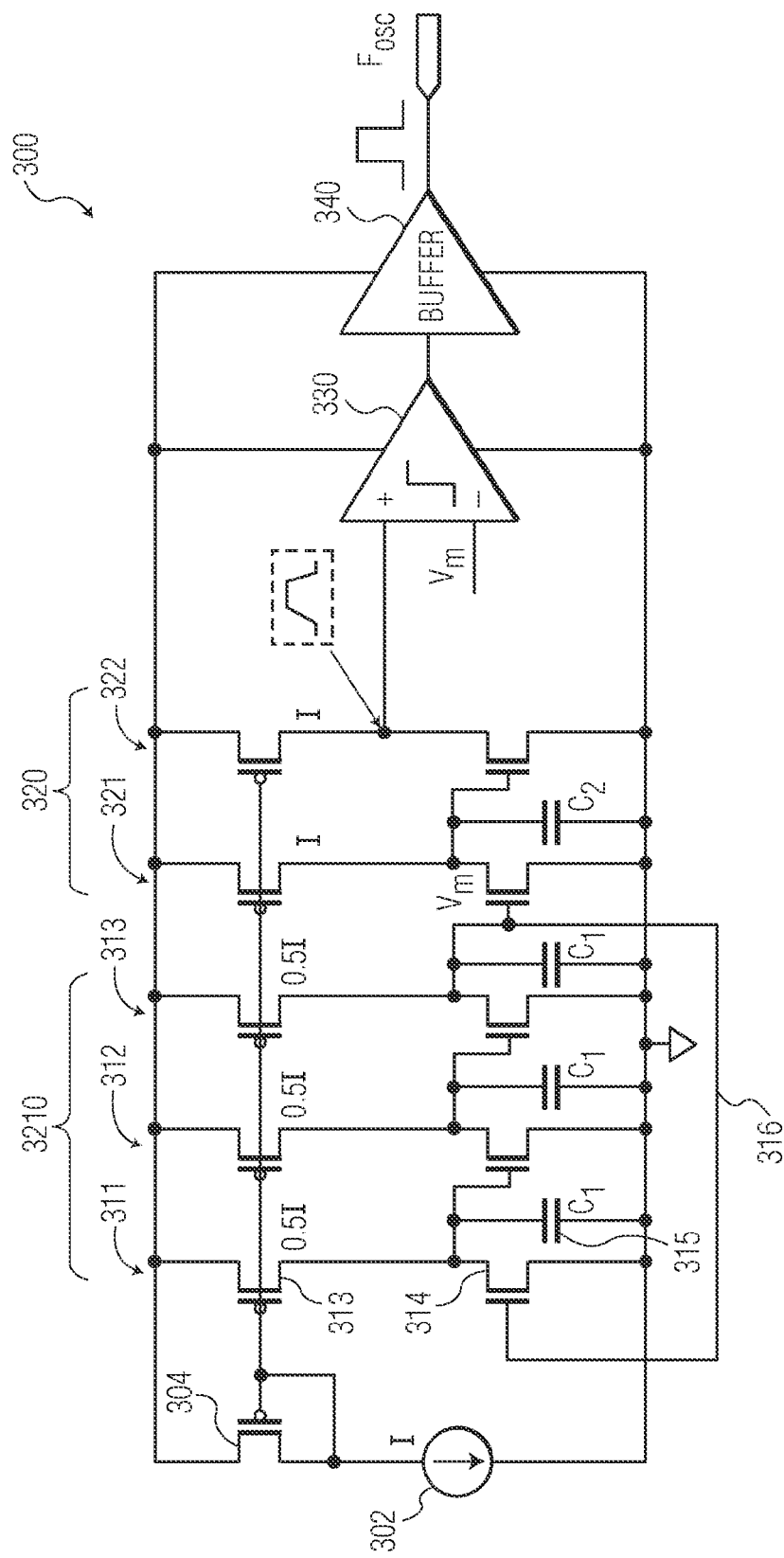
FIG. 3 shows another oscillator apparatus employing a comparator, in accordance with an example embodiment of the present invention.

FIG. 3 shows another oscillator apparatus 300, similar to the apparatus 200 shown in FIG. 2 and employing a comparator 330, in accordance with another example embodiment of the present invention. In addition to the comparator, the apparatus 300 includes sawtooth waveform generator circuitry 310, trapezoidal wave shaper circuitry 320, and a buffer 340. The sawtooth waveform generator circuitry 310 is coupled to receive a reference current from a current source 302 and transistor 304, and includes three stages 311, 312 and 313. The trapezoidal wave shaper circuitry 320 includes stages 321 and 322, each having transistors and a capacitor, similar to that labeled in stage 311, which include transistors 317 and 314, and capacitor 315. Feedback loop 316 couples the output of the third stage 313 to the gate of transistor 314. Upper transistors in stages 311, 312, 313 are shown by way of example as passing a current of a value of 0.5I, with upper transistors in stages 321 and 322 shown passing current I, which is the reference current generated via current source 302.

The trapezoidal voltage waveform output of the trapezoidal wave shaper circuitry 320 at node $V_p$ is coupled to a positive input of the comparator 330. The sawtooth voltage waveform output of the sawtooth waveform generator circuitry 310, at node $V_m$ is coupled to a negative input of the comparator 330. These respective trapezoidal and sawtooth waveforms are used by the comparator 330 to generate a clock signal that his output via buffer 340 as shown.

Using these approaches as shown in FIGS. 2-3, the clock signal can be generated without necessarily implementing an extra voltage reference coupled to the input of the comparator 330, and thus reduce overall power consumption of apparatus 300 (e.g., such that the apparatus consumes about 2 μA at room temperature, with an oscillation frequency of about 42 Khz). Further, the oscillators as implemented therein do not require feedback of output voltage to turn-on or turn-off switches that control charging or discharging of the capacitors in the preceding stages.

Figure 4:
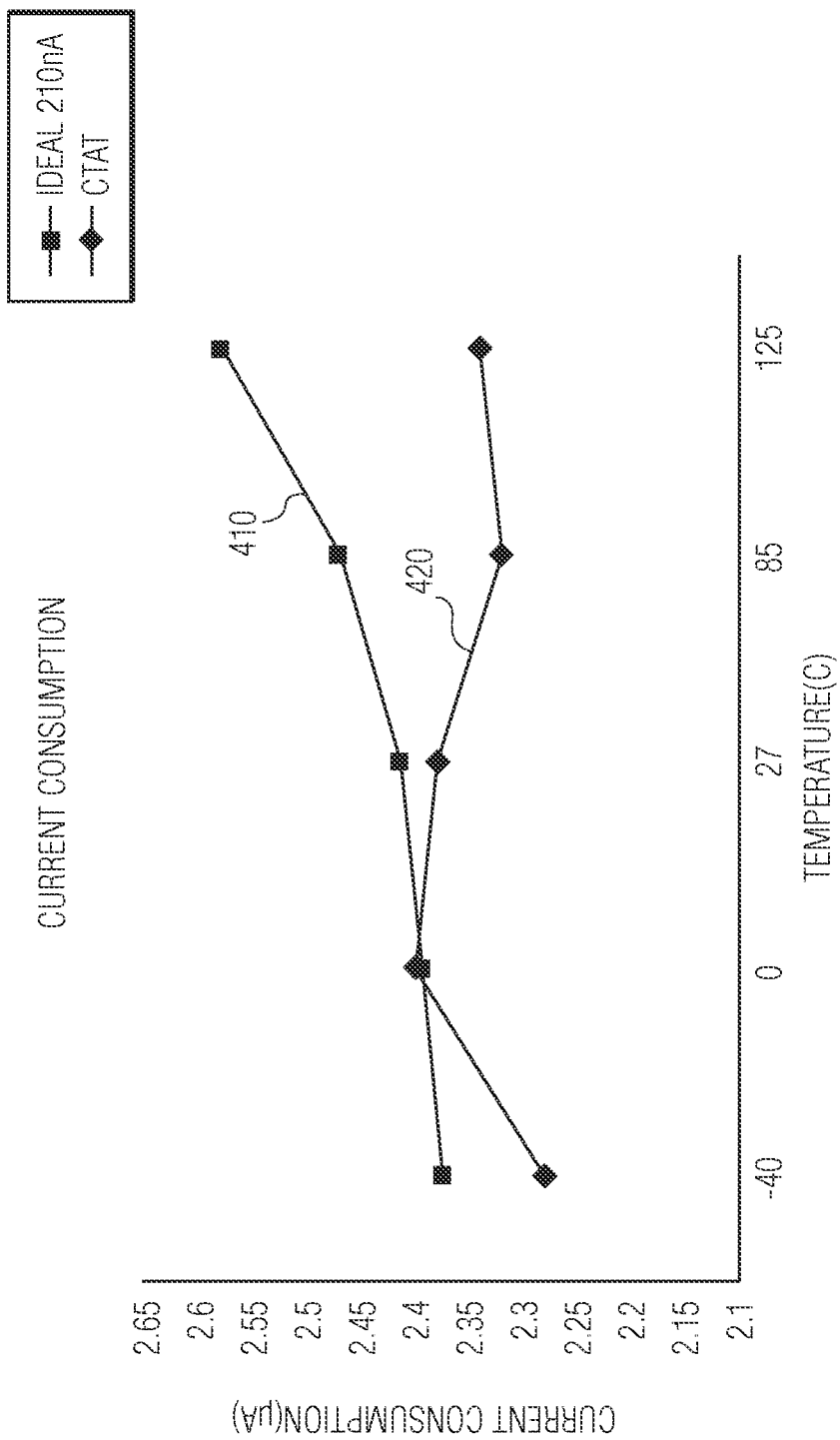
FIG. 4 shows a plot of current consumption versus temperature, as may be implemented in accordance with one or more example embodiments of the present invention.

FIG. 4 shows a plot of current consumption versus temperature for a CTAT current reference, as may be implemented in accordance with one or more embodiments herein. The vertical axis shows current consumption in microamperes, and the horizontal axis shows temperature in Celsius. For reference, plot 410 shows an ideal 210 nA source, and plot 420 shows the CTAT current reference source. Such a CTAT current reference source may, for instance, be used to reduce current consumption by the oscillator implemented with the three stages 211, 212 and 213 of the sawtooth waveform generator 210 of FIG. 2, to accommodate temperature and/or fabrication process variations.

Figure 5:
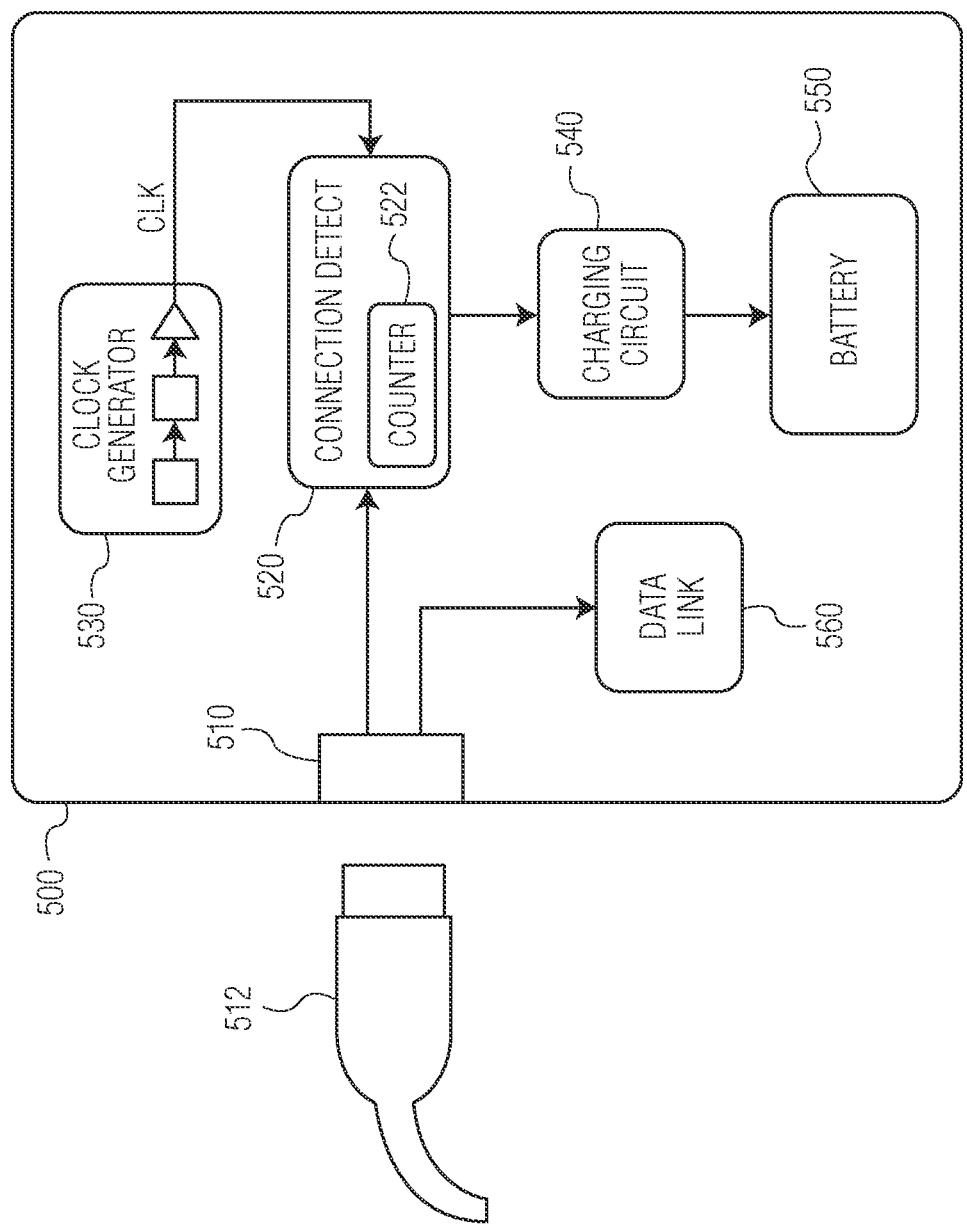
FIG. 5 shows a power connection detection apparatus, in accordance with another example embodiment of the present invention.

FIG. 5 shows a power connection detection apparatus 500, in accordance with another example embodiment of the present invention. The apparatus 500 may, for example, be implemented in a mobile device such as a mobile telephone or tablet, and in some instances includes such devices and/or is integrated with circuitry therein. The apparatus 500 includes a connection port 510 that connects to external components via a connector such as cable connector 512, and communicates data, power, or a combination of power and data, with the power being used to operate and/or charge a battery in the apparatus 500.

The apparatus 500 includes a connection detection circuit 520 and a clock generator 530, with the connection detection circuit operating on an intermittent basis to monitor the connection port 510 for the presence of power, based upon an output of the clock generator. For example, when the apparatus 500 is connected to a computer, the connector 512 may communicate both power (from the computer) and data (between the computer and the apparatus 500). When the apparatus 500 is connected to a power supply, such as a charging outlet, the connector 512 may provide purely power. Further, when the apparatus 500 is connected to a peripheral device that does not provide power, such as external speakers or a monitor, the connector 512 communicates data without charging or otherwise powering the apparatus 500.

The connection detection circuit 520 includes a counter 522, which operates to control the intermittent monitoring of the connection port 510 based upon an input from the clock generator 530. The clock generator 530 operates by generating a sawtooth waveform signal and using that sawtooth waveform signal to generate a trapezoidal waveform signal (e.g., by shaping the sawtooth waveform). In some implementations, the clock generator includes a sawtooth waveform generator that operates without R-C type circuits and/or rail-to-rail voltage, facilitating low power operation. By way of example, components within the clock generator 530 may be implemented in a manner that is consistent with one or more embodiments shown and described in connection with FIGS. 1-3, and which may involve using a ring oscillator to generate the sawtooth waveform signal. A comparator type circuit such as those described herein uses the trapezoidal waveform signal (and in some instances, also uses the sawtooth waveform signal directly) to generate an output to the counter 522.

The connection detection circuit 520 thus operates to sense the presence of power and, in response thereto, connects power received via the connection port 510 to a charging circuit 540, that can in turn be used to charge battery 550 and/or otherwise power the apparatus 500. The apparatus 500 may also include a data link circuit 560, which communicates data received via the connection port 510 with components within the apparatus 500. In some instances, the data link circuit 560 is integrated with and/or within the connection detection circuit 520.

A variety of approaches to generating a clock signal may be implemented in accordance with the embodiments discussed herein, such as in connection with the approach shown above in connection with FIG. 5. One such embodiment is directed to an apparatus having a communication port operable for connecting to one or more types of external communication circuits, and that communicates both data and power via the communication port. A connection detection circuit monitors the communication port during the time period of a sampling window and couples the power from the communication port to a charging circuit in response to sensing power provided at the communication port. The charging circuit charges a battery that powers the apparatus using power received from the external communication circuit via the communication port.

The sampling window is determined based on a clock generation circuit, in which a current reference circuit generates a reference current, and a sawtooth waveform generator that is coupled to the current reference circuit generates a sawtooth waveform output based on the reference current. A trapezoidal waveform shaper circuit receives and uses the sawtooth waveform output to provide (e.g., generate/shape) a trapezoidal waveform output using the sawtooth waveform output. A comparator circuit (e.g., as discussed above) generates the clock signal based upon the trapezoidal waveform output, and a counter circuit generates an output representing the sampling window, as having a time period that is based upon the clock signal.

The sawtooth waveform generator may, for example, include one of the nonlinear oscillators as discussed herein, such as a ring oscillator. In some embodiments, the ring oscillator includes cascaded inverters coupled to the reference current, and the current reference circuit controls current consumption of each invertor by generating the reference current based upon fluctuations in temperature. In certain implementations, the current reference circuit adjusts a reference current level in response to the fluctuations in temperature to reduce current consumption of the ring oscillator, relative to current consumption of the ring oscillator at a fixed reference current. Such a current reference circuit may, for example, employ a CTAT current reference circuit.

Figure 6:
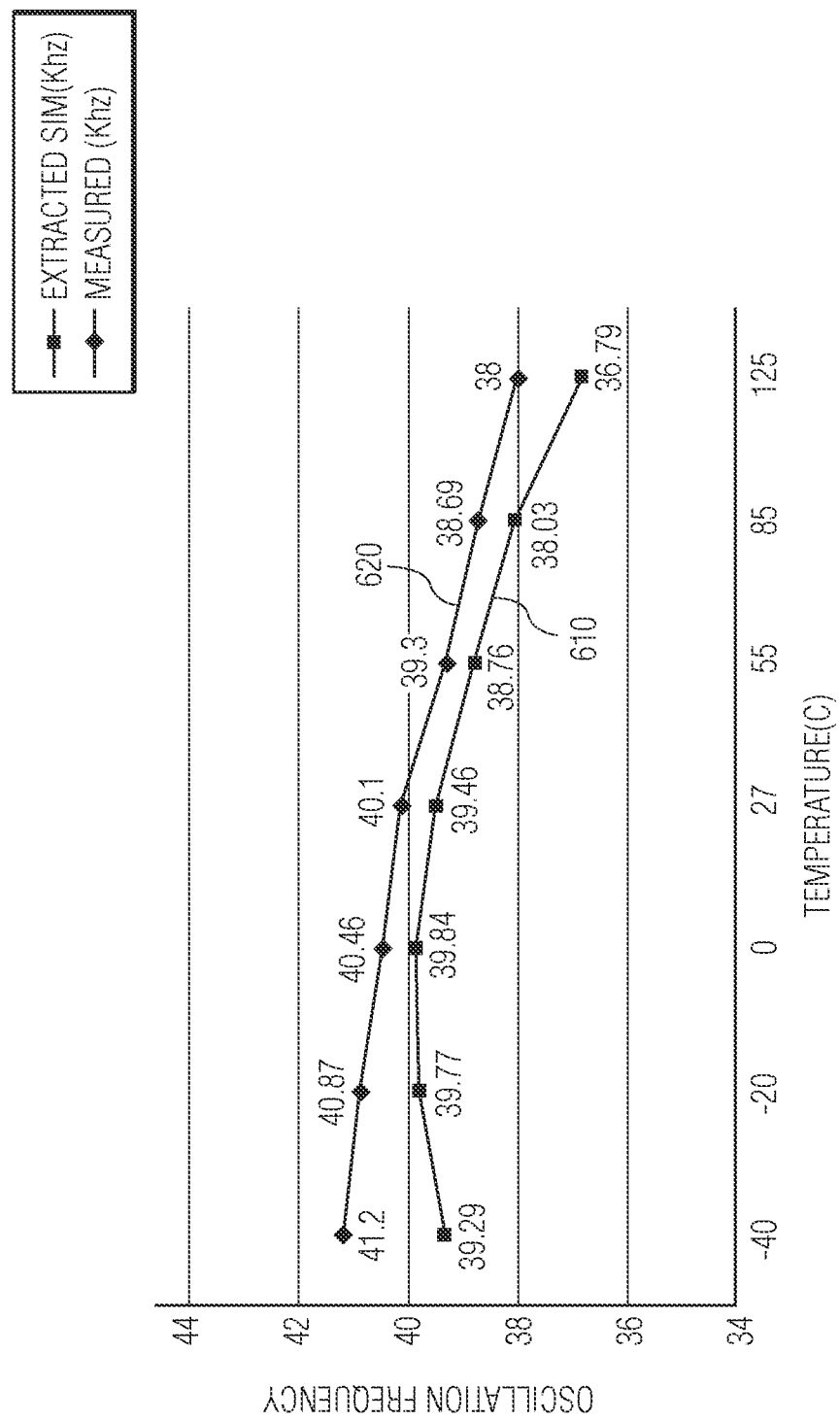
FIG. 6 shows a plot of oscillation frequency versus temperature, as may be implemented in accordance with one or more example embodiments of the present invention.

FIG. 6 shows a plot of oscillation frequency versus temperature, as may be implemented in accordance with one or more example embodiments of the present invention. Plot 610 shows an extracted simulation of frequency values, and plot 620 shows measured frequency values, using an apparatus such as described herein. For instance, a current source can be used relative to changes in temperature to generally counter temperature-related changes in this regard.

The embodiments described herein can be implemented in a variety of different types of circuits and apparatuses. Consistent with one or more embodiments described above, connection detection circuits are implanted with the oscillator/clock generation circuitry as discussed herein, as a low-power monitoring approach for detecting the connection of circuitry, such as the connection of power-providing circuitry to a device. Various such embodiments are directed to implementation with an ASIC (application-specific integrated circuit), and with communication of Thunderbolt 10 Gbit/sec or higher signals with related circuitry as available from Intel Corporation of Santa Clara, Calif.

Various blocks, modules or other circuits may be implemented to carry out one or more of the operations and activities described herein and/or shown in the Figures. In these contexts, a "block" (also sometimes "logic circuitry" or "module") is a circuit that carries out one or more of these or related operations/activities (e.g., a waveform generator or shaper, a comparator, or a connection detection circuit/module). For example, in certain of the above-discussed embodiments, one or more modules are discrete logic circuits or programmable logic circuits configured and arranged for implementing these operations/activities, as in the circuit modules shown in FIGS. 1-3. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, embodiments employing a Schmitt trigger may be implemented with a comparator having an additional input coupled to a sawtooth waveform generator. Similarly, embodiments employing a comparator may be implemented with s Schmitt trigger and omit such a coupling to the sawtooth waveform generator. Example operation at respective duty cycles can be implemented with different duty cycles, to suit particular applications. Such modifications do not depart from the true spirit and scope of various aspects of the invention, including aspects set forth in the claims.

What is claimed is:

1. An apparatus comprising:
a first circuit having a nonlinear oscillator and configured and arranged to generate a sawtooth waveform output;
a second circuit coupled to receive the sawtooth waveform output and configured and arranged to generate a trapezoidal waveform output using the sawtooth waveform output;
a comparator circuit configured and arranged to generate a clock signal based upon the sawtooth waveform output and the trapezoidal waveform output;
wherein the nonlinear oscillator is configured and arranged to generate the sawtooth waveform output using a biasing current and is susceptible to temperature-based fluctuations that alter the sawtooth waveform output under a fixed biasing current, and
further including a complementary to absolute temperature (CTAT) current reference circuit configured and arranged to control operation of the nonlinear oscillator by generating the biasing current at different levels in response to the temperature-based fluctuations.

2. The apparatus of claim 1, further including
a communication port configured and arranged to couple to external communication circuits and to communicate data and power with the external communication circuits,
a charging circuit configured and arranged to charge a battery using power provided via the communication port, and
a connection detection circuit coupled to an output of the comparator circuit and having a digital counter that controls a time period of a sampling window based upon the clock signal, the connection detection circuit being configured and arranged to
sense power provided to the communication port via an external communication circuit during the time period of the sampling window, and
in response to sensing the power, couple power from the communication port to the charging circuit.

3. The apparatus of claim 1, wherein
the comparator circuit has a first input terminal coupled to receive the trapezoidal waveform output and a second input terminal coupled to receive the sawtooth waveform output, and is configured and arranged to generate the clock signal based upon both the trapezoidal waveform output and the sawtooth waveform output respectively presented at the first and second input terminals,
the first circuit has an output terminal, via which the sawtooth waveform output is presented, connected to an input terminal of the second circuit and to the second input terminal of the comparator circuit, and
the second circuit has an output terminal, via which the trapezoidal waveform output is provided, connected to the first input terminal of the comparator circuit.

4. The apparatus of claim 1, wherein the nonlinear oscillator is a ring oscillator having a three-stage active-load inverter having three inverters connected in series, and a feedback circuit that connects an output of a last stage in the series to a first stage in the series.

5. The apparatus of claim 1, wherein the comparator is a Schmitt trigger.

6. The apparatus of claim 1, wherein the comparator generates the clock signal as a square wave having a duty cycle of about 50%.

7. The apparatus of claim 1, wherein he nonlinear oscillator is configured and arranged to generate the sawtooth waveform output using a reference current, further including
a current reference circuit configured and arranged to
generate the reference current at a first level, and
in response to a change in temperature, control current consumption of the first and second circuits by generating the reference current at a second level that is different than the first level.

8. An apparatus comprising:
a communication port configured and arranged to couple to an external communication circuit and to concurrently communicate both data and power with the external communication circuit;
a charging circuit configured and arranged to charge a battery that powers the apparatus, using power received from the external communication circuit via the communication port;
a current reference circuit configured and arranged to generate a biasing current;
a sawtooth waveform generator circuit coupled to the current reference circuit and configured and arranged to generate a sawtooth waveform output based on the biasing current;
a trapezoidal waveform shaper circuit coupled to receive the sawtooth waveform output and configured and arranged to provide a trapezoidal waveform output using the sawtooth waveform output;
a comparator circuit configured and arranged to receive the trapezoidal waveform output and to generate a clock signal based upon the trapezoidal waveform output;
a counter circuit configured and arranged to generate a sampling window output having a time period that is based upon the clock signal; and
a connection detection circuit configured and arranged to
monitor the communication port during the time period of the sampling window, based on the sampling window output, and
in response to sensing power provided to the communication port by the external communication circuit, couple the power from the communication port to the charging circuit.

9. The apparatus of claim 8, wherein the sawtooth waveform generator circuit includes a ring oscillator.

10. The apparatus of claim 9, wherein the ring oscillator includes cascaded inverters coupled to the biasing current, and the current reference circuit is configured and arranged to control current consumption of each invertor by generating the biasing current based upon fluctuations in temperature.

11. The apparatus of claim 10, wherein the current reference circuit is configured and arranged to adjust a level of the biasing current in response to the fluctuations in temperature to reduce current consumption of the ring oscillator, relative to current consumption of the ring oscillator at a fixed biasing current.

12. The apparatus of claim 8, wherein the comparator circuit has a first input coupled to receive the trapezoidal waveform output and a second input coupled to receive the sawtooth waveform output, and is configured and arranged to generate the clock signal based upon both the trapezoidal waveform output and the sawtooth waveform output respectively presented at the first and second inputs.

13. The apparatus of claim 8, wherein
the sawtooth waveform generator is susceptible to temperature-based fluctuations that alter the sawtooth waveform output under a fixed biasing current, and
the current reference circuit is a complementary to absolute temperature (CTAT) current reference circuit configured and arranged to control operation of the sawtooth waveform generator by generating the biasing current at different levels in response to the temperature-based fluctuations.

14. A method comprising:
generating a sawtooth waveform signal using a nonlinear oscillator;
generating trapezoidal waveform signal using the sawtooth waveform signal;
generating a clock signal based upon the sawtooth waveform signal and the trapezoidal signal;
wherein generating the sawtooth waveform signal includes using a ring oscillator and a biasing current, the ring oscillator being susceptible to temperature-based fluctuations that alter the generated oscillator signal under a fixed biasing current, and
further including mitigating the temperature-based fluctuations by controlling a level of the biasing current provided to the ring oscillator.

15. The method of claim 14, further including
controlling a time period of a sampling window based upon the clock signal,
sensing power provided to a communication port via an external communication circuit during the time period of the sampling window,
in response to sensing the power, coupling power from the communication port to a charging circuit, and
charging a battery using power provided via the communication port and the charging circuit.

16. The method of claim 14, wherein generating the clock signal includes
generating the clock signal based upon both the trapezoidal waveform signal and the sawtooth waveform signal,
using a comparator having first and second inputs respectively coupled to receive the trapezoidal and sawtooth waveform signals,
using a circuit that connects an output terminal of the nonlinear oscillator, via which the sawtooth waveform is provided, to both a trapezoidal waveform generator that generates the trapezoidal waveform and the comparator.

17. The method of claim 14, wherein generating the sawtooth waveform signal includes
using a ring oscillator circuit having a three-stage active-load inverter in which three inverters are connected in series, and
further using a feedback circuit that connects an output of a last stage in the series to an input of a first stage in the series.

18. An apparatus comprising:
a first circuit having a nonlinear oscillator and configured and arranged to generate a sawtooth waveform output;
a second circuit coupled to receive the sawtooth waveform output and configured and arranged to generate a trapezoidal waveform output using the sawtooth waveform output;
a comparator circuit configured and arranged to generate a clock signal based upon the sawtooth waveform output and the trapezoidal waveform output;
wherein the nonlinear oscillator is a ring oscillator having a three-stage active-load inverter, each stage being coupled to receive a biasing current, and
further including a current reference circuit configured and arranged to generate the biasing current for active loads in each stage of the three-stage active-load inverter.

\* \* \* \* \*